United States Patent [19]

Cideciyan et al.

[11] Patent Number: 5,177,482
[45] Date of Patent: Jan. 5, 1993

[54] RLL ENCODER AND DECODER WITH PIPELINED PLURAL BYTE PROCESSING

[75] Inventors: Roy D. Cideciyan, Thalwil; Erwin A. Zurfluh, Feldmeilen, both of Switzerland

[73] Assignee: International Business Machines Incorporated, Armonk, N.Y.

[21] Appl. No.: 729,264

[22] Filed: Jul. 12, 1991

[30] Foreign Application Priority Data

Aug. 16, 1990 [EP] European Pat. Off. ............ 90810614

[51] Int. Cl.$^5$ .......................................... H03M 7/00
[52] U.S. Cl. .......................................... 341/59; 360/40
[58] Field of Search ............... 341/58, 59, 68, 69, 341/70, 71, 72, 73, 106; 360/40, 41

[56] References Cited

U.S. PATENT DOCUMENTS

| | | | |
|---|---|---|---|
| 3,995,264 | 11/1976 | Ouchi | 341/58 |
| 4,486,739 | 12/1984 | Franaszek et al. | 341/59 |
| 4,551,773 | 11/1985 | Cohn et al. | 360/40 |
| 4,617,552 | 10/1986 | Kojima et al. | 341/58 |
| 4,684,921 | 8/1987 | Fok et al. | 341/59 |
| 4,688,016 | 8/1987 | Fok | 341/59 |
| 4,864,303 | 9/1989 | Ofek | 341/58 X |

FOREIGN PATENT DOCUMENTS

| | | |
|---|---|---|
| 0097763 | 1/1984 | European Pat. Off. |
| 0138229 | 4/1985 | European Pat. Off. |
| 3444315 | 6/1986 | Fed. Rep. of Germany |
| 3608357 | 9/1987 | Fed. Rep. of Germany |

Primary Examiner—Howard L. Williams
Attorney, Agent, or Firm—Edward H. Duffield

[57] ABSTRACT

For encoding a stream of k-bit data bytes into a stream of m-bit code bytes satisfying given constraints, a coding principle and coder apparatus are disclosed which allow pipelined and parallel handling of the byte stream. Each data byte DB and an associated coder state indicator S are together converted into a code byte CB. The coder state indicator S(i) to be associated with a data byte DB(i) is obtained by logically combining the coder state indicator S(i-1) of the preceding data byte DB(i-1) and a state transition indicator T(i-1) derived from the latter. This allows the simultaneous generation of all coder state indicators S for a whole group (a word) of data bytes, thereby enabling the parallel and pipelined operation of the coder.

17 Claims, 10 Drawing Sheets

RLL ENCODER AND DECODER WITH PIPELINED PLURAL BYTE PROCESSING

FIELD OF INVENTION

Present invention is concerned with the encoding of sequential data bytes each comprising k bits, into code bytes each comprising m bits, i.e. kB/mB coding with k<m, where the sequential data bytes have no restrictions, but any sequence of code bytes is constrained (e.g. bounded running digital sum RDS; limited run-length of identical symbols).

Furthermore, the present invention is concerned with a coder in which a group of several sequential data bytes can be converted simultaneously into a respective group of code bytes.

The coding technique of present invention may find application in digital data transmission as well as in magnetic or optical recording of digital data.

BACKGROUND

Line codes impose desired constraints on transmitted signals to facilitate detection in the presence of the usual transmission impairments. Signal characteristics required often in practice are spectral null at DC, spectrum with small low-frequency content, small maximum distance between transitions from one signal level to another one, and large minimum and average transition density. In binary transmission or recording schemes, such as the ones used in fiber-optical transmission and in digital magnetic recording, these desired properties of the transmitted signal can only be achieved by an increase in the channel data rate, i.e., insertion of redundancy into the data stream (coding without enlarging the set of signal levels). Among the different binary coding schemes kB/mB block codes where a k-bit byte of data is mapped into an m-bit code byte are very common. Coding schemes considered here in particular are 8B/10B block codes.

The desired properties of a line code are determined by the field of application. In fiber-optical links DC-free transmission codes are preferred because laser diode transmitters and high-sensitivity receivers are usually AC-coupled designs specified by a lower and an upper frequency limit for operation. The upper frequency limit indicates the maximum achievable channel data rate whereas the lower frequency limit determines the amount of tolerable low-frequency content in the signal spectrum. The lower frequency limit in the laser diode driver is determined by the control loop which keeps the average output power at a constant level. DC-free transmitted signals do not require a data-reference circuit in the transmitter which have been used to cope with DC-shifted signals. The lower frequency limit in the receiver is given by the AC-coupling of the analog preamplifier stages which allows better control of parasitic noise in the design of high-performance amplifier front-end circuits.

A code is DC-free if and only if the running digital sum (RDS) is bounded. The number of values RDS can take on determines the low-frequency content of the code spectrum and will be denoted by V. The digital sum variation (DSV) is then given by V-1. Capacity calculations show that V cannot be made smaller than six for a code rate 8/10. It is also true that the smaller V (or DSV) the larger the suppression of the power at low-frequencies in the code spectrum to facilitate AC-coupling.

Accurate timing recovery at the receiver requires the presence of enough transitions between the signal levels +1 and −1 (or zero crossings) in transmitted binary sequences. There are three parameters which determine the code performance with respect to timing recovery: maximum runlength of identical symbols R, minimum density of transitions in encoded sequences $TD_{min}$, and average density of transitions in encoded sequences $TD_{av}$. Capacity calculations show that R cannot be made smaller than three for a code rate 8/10.

The decoders for line codes are usually block decoders to avoid infinite error propagation. In particular, a block decoder for a kB/mB code has the desirable property that errors in a single m-bit code byte at its input can only affect a single k-bit data byte at its output. Such a block decoder can also be used to detect invalid code bytes by raising a flag if the input of the decoder is a m-bit byte which is not a permitted code byte. Another important aspect of a block decoder is its synchronization, i.e., the capability to infer from the incoming serial stream of bits where the code byte boundaries are. This is usually achieved by embedding a j-bit sync pattern in a m-bit sync byte and inserting it into the stream of transmitted code bytes. Thereby the j-bit sync pattern is chosen such that it cannot occur anywhere in the stream of code bytes. Another desired property associated with a sync byte is that it differs from all code bytes in two or more bits to decrease the probability of a code byte being mistaken for a sync byte because of transmission errors.

It is also often required that a kB/mB line code provides an adequate number of special m-bit bytes which can be used for framing and control purposes. These special bytes, which do not represent data, should satisfy the code constraints. Finally, encoders/decoders at very high channel data rates should offer multiple-byte interface for implementation and interconnection reasons.

A DC-free partitioned block 8B/10B code for packet transmission on optical fibers was described in U.S. Pat. No. 4,486,739 (Widmer and Franaszek). This code interleaves code bytes from a 3B/4B and 5B/6B code allowing a simple logic implementation and has the following properties:

Parallel bytewise coding; DC-free line signal; V=7 (DSV=6); R=5; $TD_{min}=30\%$; $TD_{av}=60\%$; single bit transmission error leads to one erroneous byte (block decoder); capability of detecting invalid code bytes; 9 special bytes for control and 3 possible sync bytes.

One of the sync bytes differs from all code bytes in two or more bits. However, the repetition of this particular sync byte is not permitted. The other two sync bytes differ from some code bytes in only one bit and can be repeated with a transition density of 30% and 50%. The logic gates used for implementing the code are required to have gate delays of no more than a baud interval. Considering that a channel data rate of 2.4 Gbit/s corresponds to a gate delay of 0.416 ns, the implementation of this coding scheme at this speed becomes very difficult.

U.S. Pat. No. 4,488,142 (Franaszek) and U.S. Pat. No. 4,888,779 (Karabed and Siegel) both disclose coding apparatus in which the coder receives, besides a next group of input data bits, coder state information which is derived from the encoded data. However, no parallel encoding is possible with these coders because the coder state information is obtained only at the output of the encoder apparatus.

OBJECTS OF INVENTION

It is an object of present invention to devise a coding technique and apparatus for converting a sequence of unconstrained data bytes into a sequence of code bytes satisfying certain constraints, which allow the simultaneous conversion of several data bytes into respective code bytes.

It is a further object of the invention to devise such coding technique and apparatus which enable pipelined operation so that encoding of a next group of data bytes can be started while the encoding of a current group of data bytes is still ongoing, so that pipelined operation is possible.

It is another object of the invention to provide a coding technique and apparatus for pipelined and parallel operation which allow decoding without error propagation beyond the current block of data bytes, and which result in very simple construction of the encoder and decoder apparatus.

SUMMARY OF INVENTION

The encoder apparatus in accordance with the invention uses a transmission code created by parallel and pipelined encoding techniques in combination. This encoding method has the great advantage that, due to parallel and pipelined encoding operations very high speed encoding can be achieved. This is particularly advantageous when data are to be transmitted at Gbit/s rates over optical links.

The combined parallel and pipelined transmission code is DC component free and allows an AC-coupled implementation. This leads to a substantial reduction in circuit count by avoiding the use of bias-restoration circuits.

Preferred embodiments of the invention are described in the following with reference to the drawings.

LIST OF FIGURES

Figure 2:
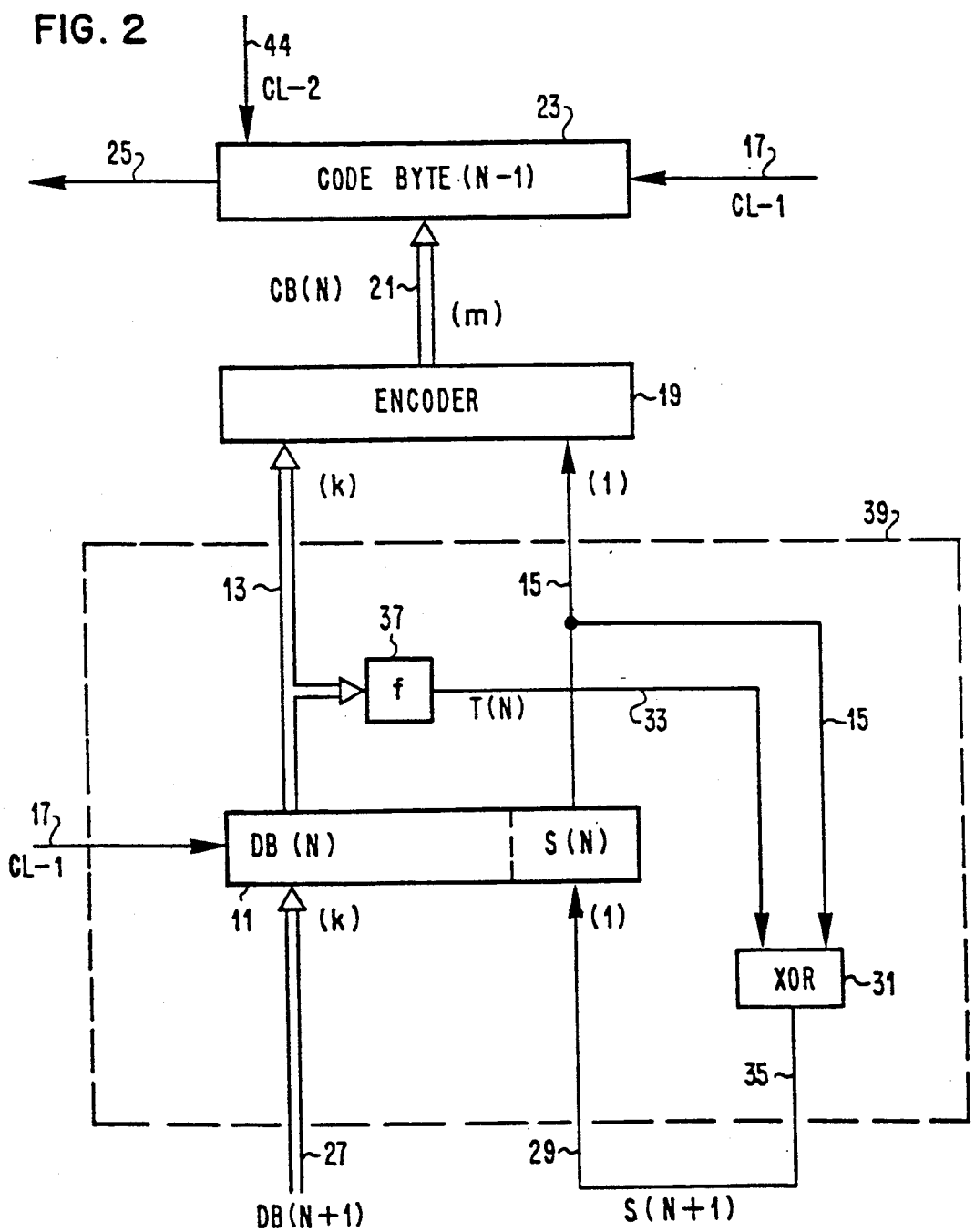
FIG. 2 is a block diagram of basic circuitry for encoding a data byte according to the invention, using a two-state coding technique.
Figure 5:
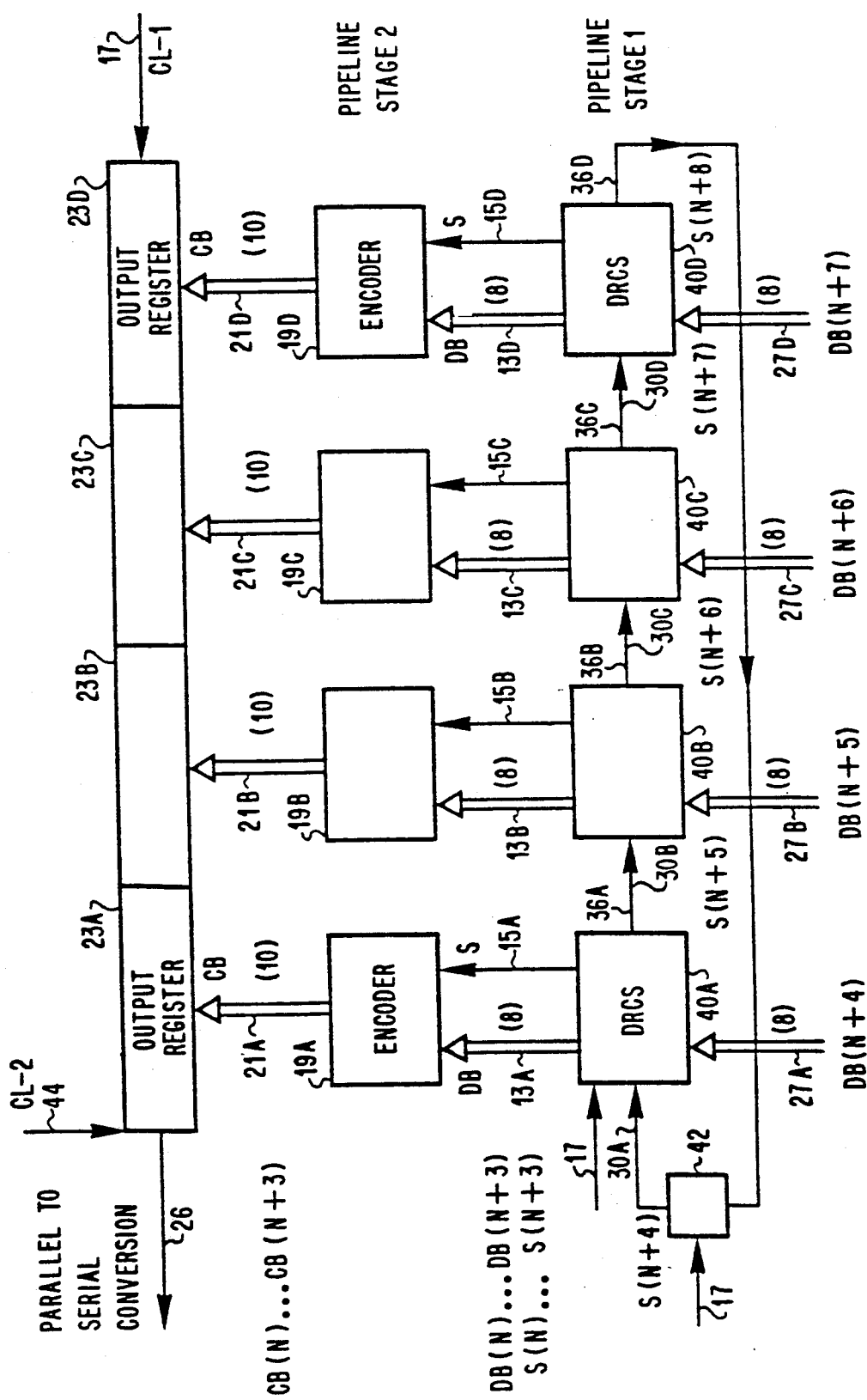
FIG. 5 shows the principal block diagram of encoder apparatus according to the invention, providing four parallel sections and two pipelined stages.
Figure 6A:
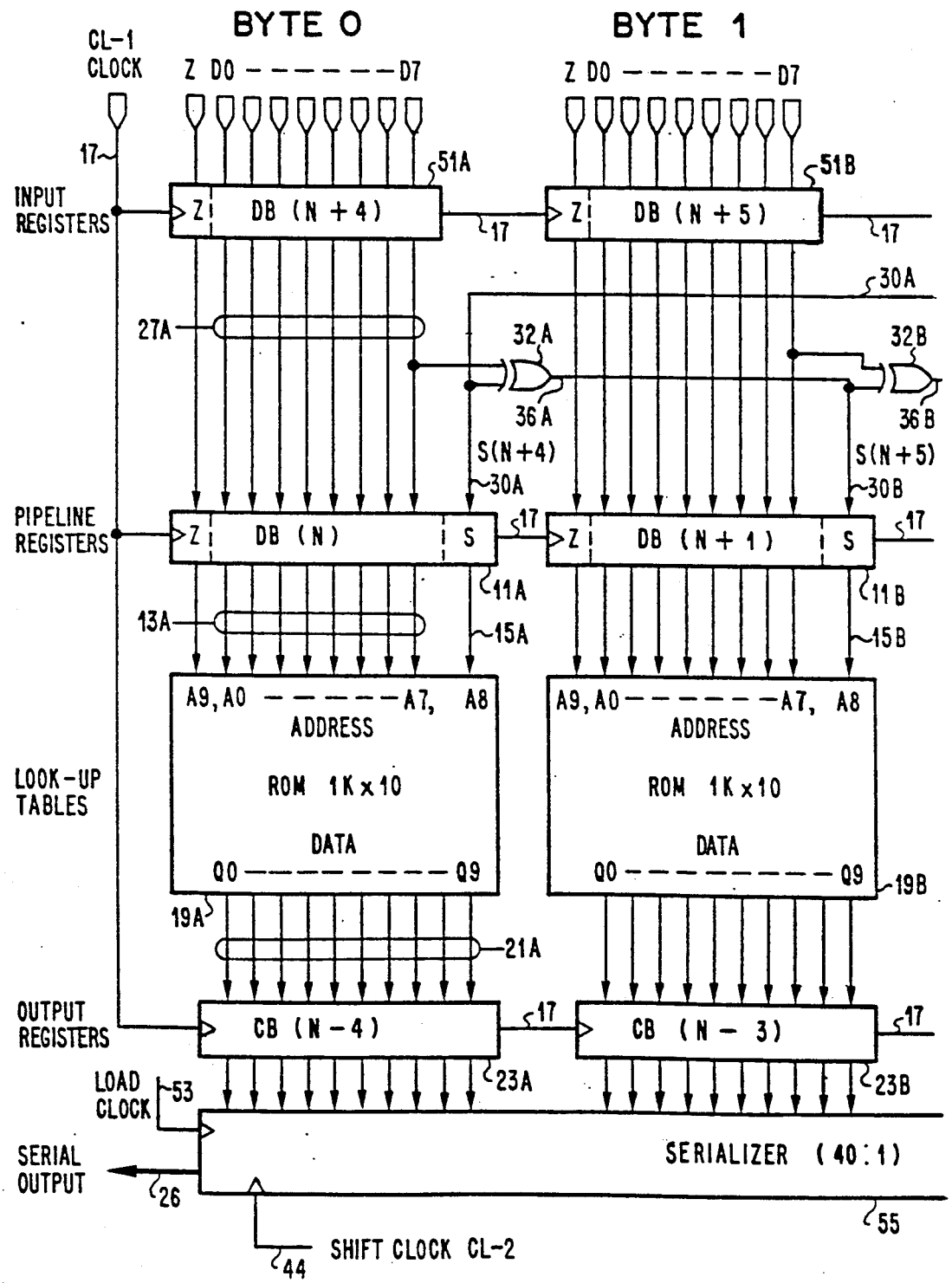
Figure 6B:
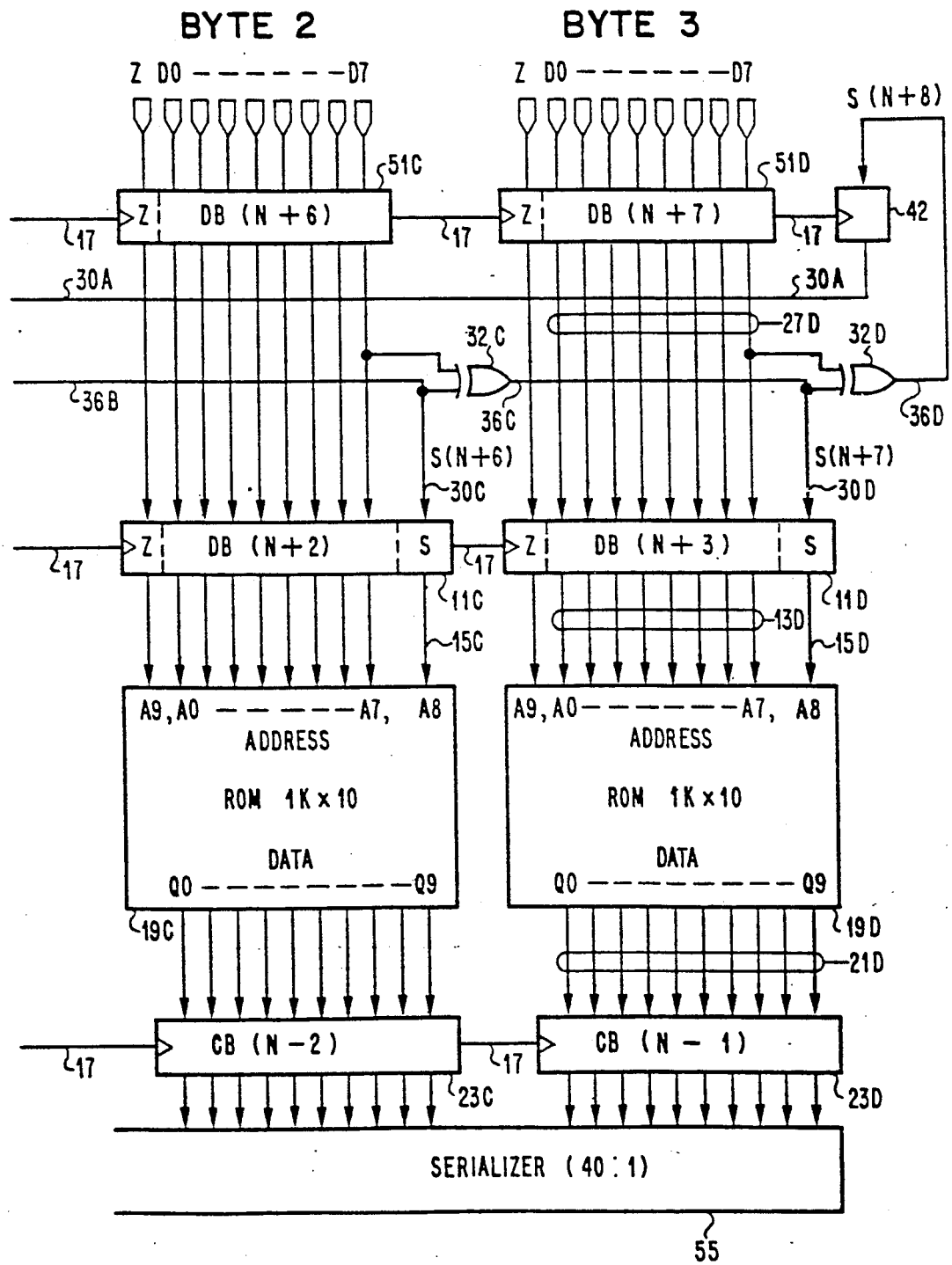
Figure 7A:
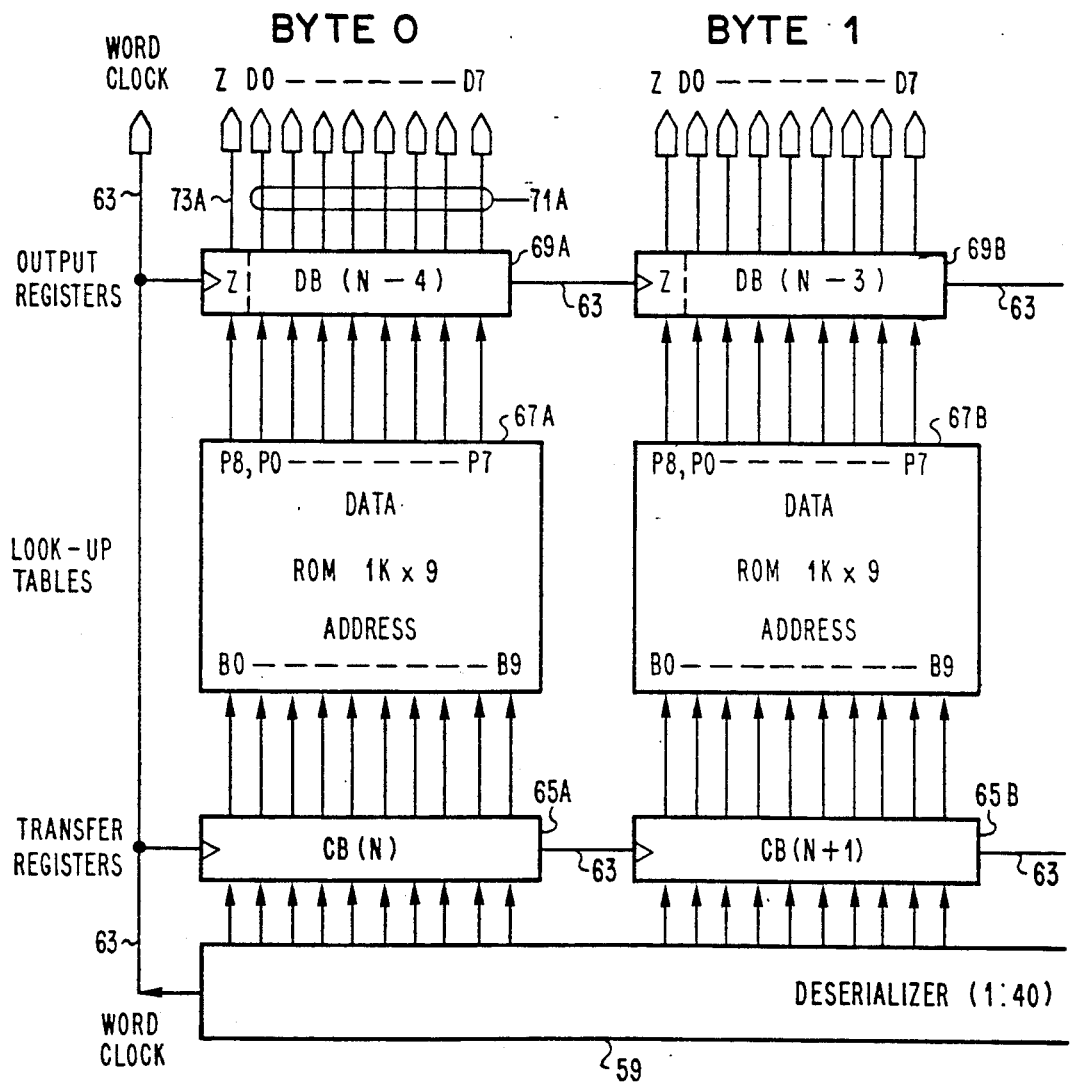
Figure 7B:
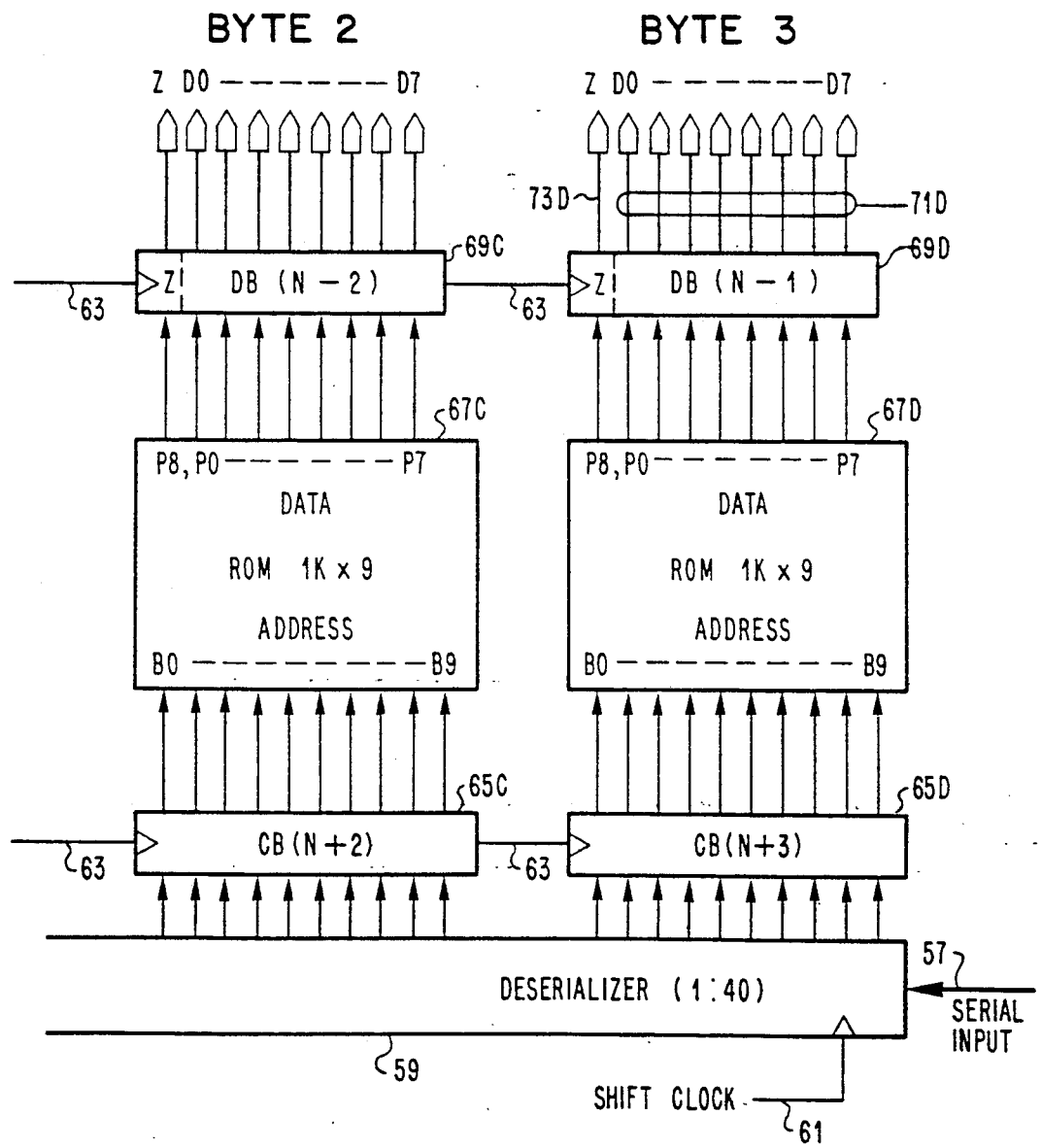
Figure 8:
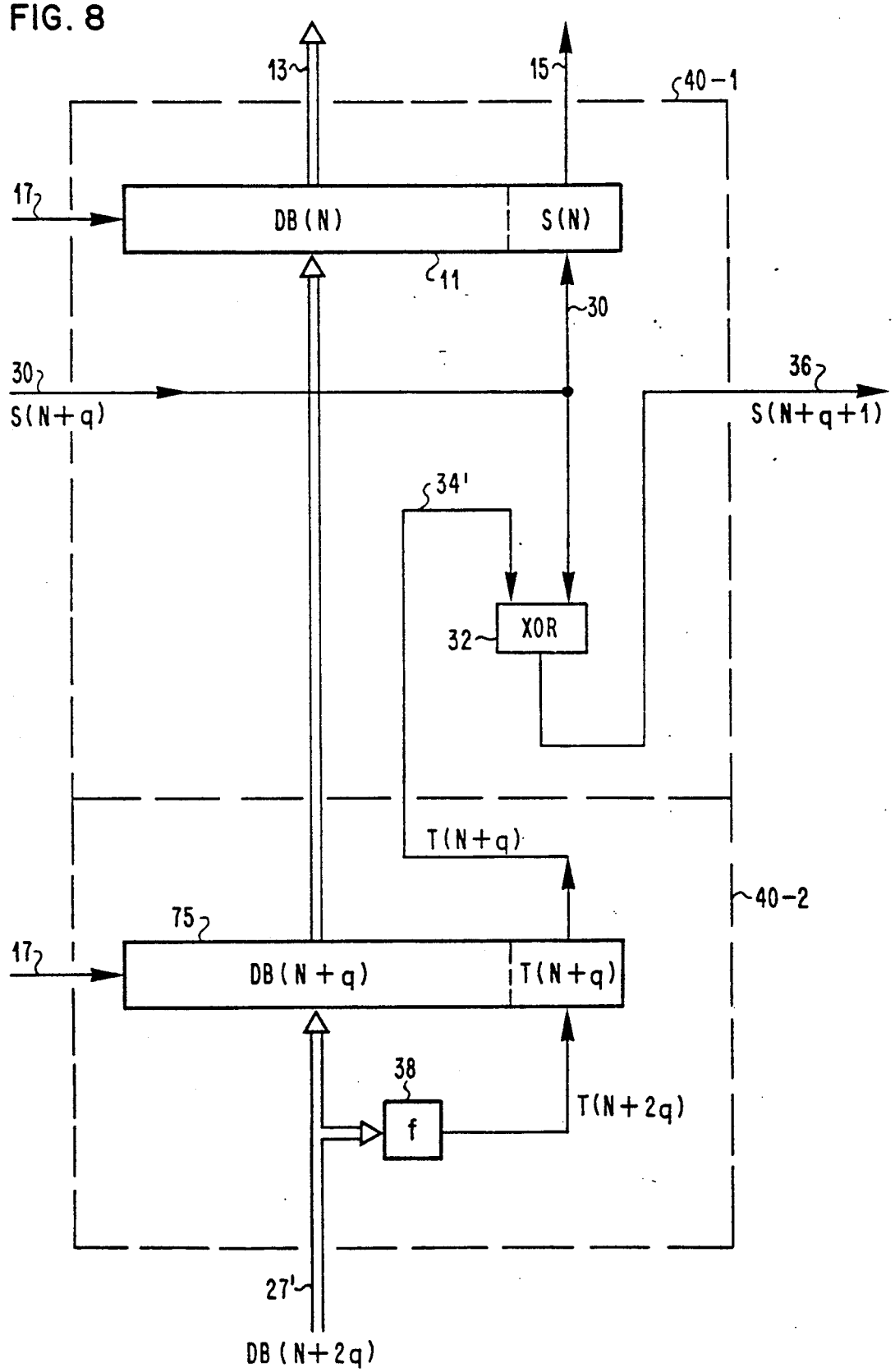

FIGS. 6A/6B show a more detailed block diagram of an 8B/10B encoder apparatus designed according to the principle shown in FIG. 5;

FIGS. 7A/7B show a detailed block diagram for a 10B/8B decoder which is designed to operate in conjunction with the encoder of FIGS. 6A/6B;

FIG. 8 shows a modified register stage for the basic coder circuitry of FIG. 2, requiring an extra register per coder section but allowing operation at higher speeds.

Table 1 and Table 2 present a selection of 10-bit code bytes to be used as ROM contents in the encoder apparatus of FIGS. 6A/6B, providing the required code constraints.

MEANING OF SOME TERMS USED IN THE DESCRIPTION

In the introduction above and in the following description, the term "byte" is used to designate any bit group comprising a predetermined number of bits, e.g. 8-bit data bytes and 10-bit code bytes, or generally k-bit data bytes and m-bit code bytes. A given number of bytes may form a word, e.g. four 10-bit code bytes may constitute a 40-bit code word. Thus, it should be noted that the term "byte" in the following description is not restricted to 8-bit entities. Furthermore, it should be noted that in some literature and patents, the term "data word" and "code word" are used for those bit groups which are designated as bytes in the present description.

Essential features of the invented method and apparatus are a state transition function T and a coder state function S. While in a general case they will be multiple valued functions termed "state transition indicator T" and "coder state indicator S", these functions are binary in the disclosed preferred embodiment of a two-state coder, and therefore are termed in the description "state transition bit T" and "coder state bit S".

DETAILED DESCRIPTION

1. Principles of Coding Scheme

Figure 1:
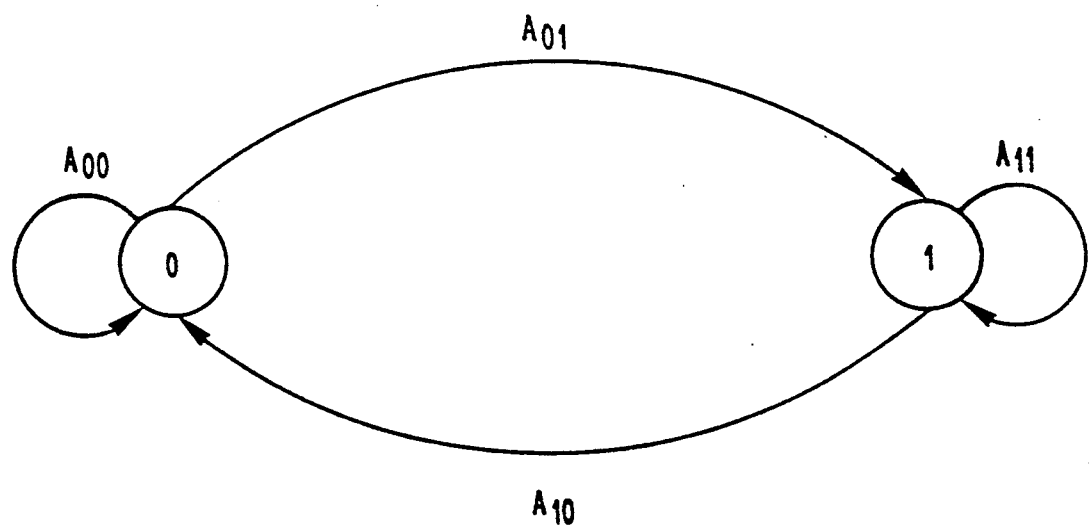
FIG. 1 is a state transition diagram illustrating the possible transitions between the two encoder states provided in the preferred embodiment of the invented coding technique.

A state transition diagram illustrating the two coder states and the four coder state transitions which are provided in the preferred embodiment of the invented coding scheme is shown in FIG. 1. Generally, a conversion is made from k-bit data bytes to m-bit code bytes. At time n, one m-bit code byte out of a code byte set $A_{ij}$ is generated as a result of a transition from state i at time n to state j at time n+1 where i=0, 1 and j=0, 1. For the 8B/10B code proposed here $|A_{00}| = |A_{01}| = |A_{10}| = |A_{11}| = 128$ where $|X|$ stands for the number of code bytes in X.

The coder state at time n is equal to the running digital sum (RDS) achieved after generating a code byte at time n−1. RDS is computed after NRZ modulation of the binary stream, i.e., after mapping 0 into −1 and 1 into +1. State 0 corresponds to RDS= −1 whereas state 1 corresponds to RDS= +1. Hence the code bytes in $A_{00}$ and $A_{11}$ have disparity 0 (they have five 0's and five 1's) whereas the code bytes in $A_{01}$ and $A_{10}$ have disparity +2 (they have four 0's and six 1's) and −2 (they have six 0's and four 1's), respectively. Furthermore, the code bytes in $A_{00}$, $A_{01}$, $A_{10}$ and $A_{11}$ are chosen such that they satify the following four constraints:

a) Constraint on the maximum run length of identical symbols

None of the code bytes in $A_{00}$, $A_{01}$, $A_{10}$ and $A_{11}$ does contain six (or more) consecutive 0's or 1's. The code bytes $A_{00}$ and $A_{10}$ leading to state 0 do not end with four 0's or three 1's, and the code bytes $A_{01}$ and $A_{11}$ leading to state 1 do not end with four 1's or three 0's; furthermore, the code bytes in $A_{00}$ and $A_{01}$ emanating from state 0 do not begin with four 1's or three 0's, and the code bytes in $A_{10}$ and $A_{11}$ emanating from state 1 do not begin with four 0's or three 1's. These rules ensure that the maximum run length of identical symbols in a stream of code bytes is five (R=5).

b) Constraint on the minimum transition density

A minimum transition density of $TD_{min}=40\%$ is ensured by choosing all the code bytes such that they have at least four transitions where a transition occurs if a zero follows a one or a one follows a zero.

c) Constraint on the maximum number of RDS values

Let $a_1a_2\ldots a_{10}$ be either a code byte in $A_{00}$ or $A_{01}$ emanating from state 0 with $RDS=-1$, or a code byte in $A_{10}$ or $A_{11}$ emanating from state 1 with $RDS=+1$; and let $b_1b_2\ldots b_{10}$ be the corresponding NRZ modulated waveform, i.e., $b_i=+1$ is $a_i=1$ and $b_i=-1$ if $a_i=0$. The code bytes $a_1a_2\ldots a_{10}$ in $A_{00}$ or $A_{01}$ must be chosen such that $-3 \leq -1+b_1+b_2+\ldots+b_i \leq +3$ and the code bytes $a_1a_2\ldots a_{10}$ in $A_{10}$ or $A_{11}$ must be chosen such that $-3 \leq 1+b_1+b_2+\ldots+b_i \leq +3$, for $i=3,4,\ldots 10$. These rules ensure that the RDS in a stream of code bytes assumes only seven values $-3, -2, -1, 0, +1, +2, +3$ (V=7).

d) Constraint related to the sync byte

Frame synchronization is achieved by sending sync bytes prior to the transmission of data. The sync byte generated when the encoder is in state 0 (1) is chosen to be 0101111100 (1010000011) and imbeds the unique sync pattern 1011111 (0100000). A stream of sync bytes then has a transition density of 50%. The code bytes are chosen such that both sync patterns cannot occur anywhere in a stream of code bytes in order to enable the decoder to realign the code byte boundaries after loss of synchronization. All the code bytes which differ from a sync byte or its complement in only one bit are also not allowed to occur. This decreases the likelihood of a code byte being mistaken for a sync byte because of transmission errors and vice versa. It should be noted that during transmission of the synchronization sequence consisting of sequential sync bytes, the coder state changes after each sync byte, i.e. the two complementary sync bytes are used alternatingly.

Tables 1 and 2 give two lists P and Q of potential code bytes containing 161 and 129 ten-bit bytes, respectively. The list of code bytes in $A_{00}$, $A_{01}$, $A_{10}$ and $A_{11}$ must be chosen such that $A_{00}$ is a subset of P and $A_{01}$ is a subset of Q, and that $A_{11}=\overline{A_{00}}$ and $\overline{A_{10}}=\overline{A_{01}}$, where $\overline{X}$ is obtained by complementing all bytes in X. The two lists P and Q were obtained following the rules given above. The concatenation of bytes in P, Q, $\overline{P}$ and $\overline{Q}$ following the state transition rules results in a stream of bytes satisfying the desired constraints. Note that only P and $\overline{P}$ have common bytes, i.e., bytes in Q do not occur in P, $\overline{P}$ or $\overline{Q}$, and bytes in $\overline{Q}$ do not occur in P, $\overline{P}$ or Q. Finally, since only 256 code bytes are needed at each state, the number of bytes that are available for control purposes is given by subtracting 256 from the sum of the number of bytes in P and Q, i.e., by $161+129-256=34$. For the actual code bytes sets to be used (i.e. to be stored in a ROM), 128 code bytes are selected from the set P and Q, respectively. This selection can be arbitrary, or it can be made so that the remaining 128-byte sets satisfy any further constraints which are selected for a specific application. The 34 bytes cancelled in such selection are then available as special bytes for control purposes.

The state transition principles allowing multiple-byte interface and encoder/decoder implementation at several Gbit/s will be discussed in the next section. In summary the proposed 8B/10B code has the following properties:
  parallel bytewise coding
  DC-free line signal
  V=7 (DSV=6)
  R=5
  $TD_{min}=40\%$
  $TD_{av}=63\%$
  single bit transmission error leads to one erroneous byte (block decoder)
  capability of detecting invalid code bytes
  34 special bytes for framing and control and 1 sync byte
  sync byte differs from any code byte in at least two bits
  stream of sync bytes has 50% transition density
  multiple-byte interface without degradation of code performance
  implementation at very high channel data rates 2. State Transitions The assignment of 256 data bytes $D_0D_1\ldots D_7$ to the code bytes in $A_{00}$ and $A_{01}$ ($A_{10}$ and $A_{11}$) when the encoder is in state 0 (1) follows two rules:

1) Regardless of the particular encoder state the same code byte should not be assigned to two different data bytes.

2) If one of the 128 bytes with $D_7=0$ is at the input of the encoder which is in state 0 (1), the encoder selects a code byte from the list $A_{00}$ ($A_{11}$), i.e., the state of the encoder does not change after the generation of the code byte. If one of the 128 bytes with $D_7=1$ is at the input of the encoder which is in state 0 (1), the encoder selects a code byte from the list $A_{01}$ ($A_{10}$), i.e., the state of the encoder does change after the generation of the code byte.

Rule 1 ensures that the decoder can be realized as a block decoder mapping the code bytes at its input into the original data bytes. Errors in a ten-bit byte at the input of the block decoder cause only a single decoded data byte being in error. If the decoder input is a ten-bit byte which is not in $A_{00}$, $A_{01}$, $A_{10}$ and $A_{11}$ the decoder raises a flag indicating the detection of an invalid code byte.

Rule 2 ensures that a single bit of a data byte toggles the state of the encoder, i.e., the next state at time $n+1$ is equal to the present state at time n if the last bit of the input data byte at time n is 0, i.e., $D_7(n)=0$, whereas the next state at time $n+1$ is unequal to the present state at time n if $D_7(n)=1$. The choice of $D_7$ is arbitrary and any other bit $D_i$, $i=0,1,\ldots,6$ can be chosen to toggle the encoder state. Let S(n) denote the present encoder state and $S(n+1)$ the next encoder state. Then state toggling in its simplest form described above can be expressed as $S(n+1)=S(n)\oplus D_7(n)$ where $\oplus$ stands for the XOR operation.

The principle of state toggling can be generalized and used with other encoders. Let us assume that FIG. 1 represents a two-state encoder for a kB/mB code with $|A_{00}|=|A_{11}|$ and $|A_{01}|=A_{10}|$. The total number of m-bit code bytes that can be generated in each state is $|A_{00}|+|A_{01}|=|A_{10}|+|A_{11}|=2^k$. State toggling in this case can be expressed as $S(n+1)=S(n)\oplus T(n)$ where the state transition variable T(n) is a function of the input byte, i.e., $T(n)=f(D_0(n), D_1(n),\ldots, D_{k-1}(n))$, assuming the value 0 in $|A_{00}|$ cases and 1 otherwise. In the case of the 8B/10B coding scheme proposed here, $f(D_0(n), D_1(n), \ldots, D_7(n)) = D_7(n)$.

3. Implementation

It is desirable that the 8B/10B block coder/decoder operates in parallel on 2 or 4 bytes. Multiple sets of independent block coders to match the interface data path width are not preferred, because the performance of the code diminishes mainly due to an increase in DSV.

For the invented coding scheme an implementation is presented providing pipelined operation and a single feed-back state variable which is defined by a 2-input XOR gate function. This new coding scheme offers the unique potential for designing mutually dependent coders for multiple-byte interfaces.

3a. Basic Coder Units

Figure 3:
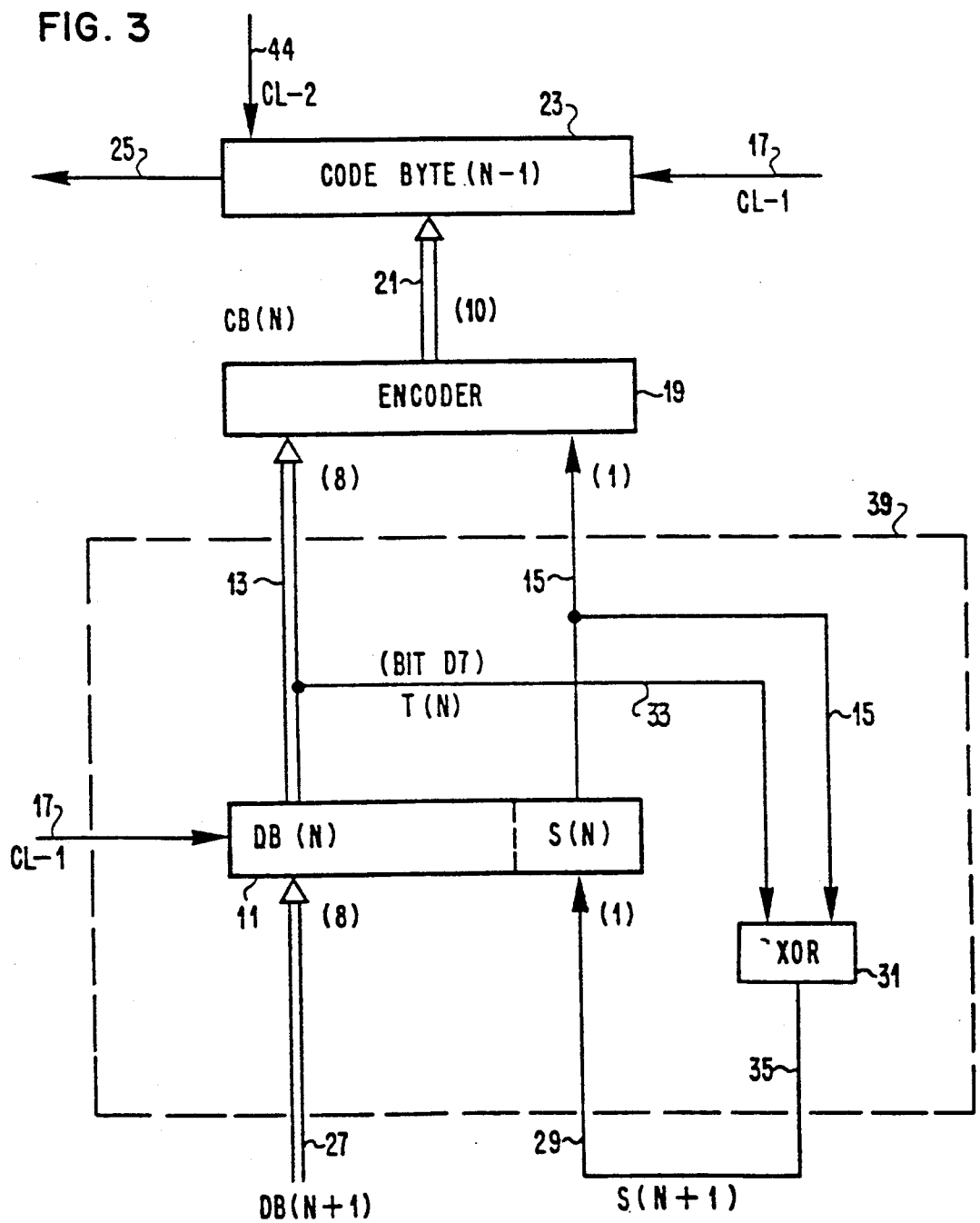
FIG. 3 is a block diagram of simplified basic encoding circuitry in which only a single bit of the current data byte is used for determining the coder state for the next data byte.
Figure 4:
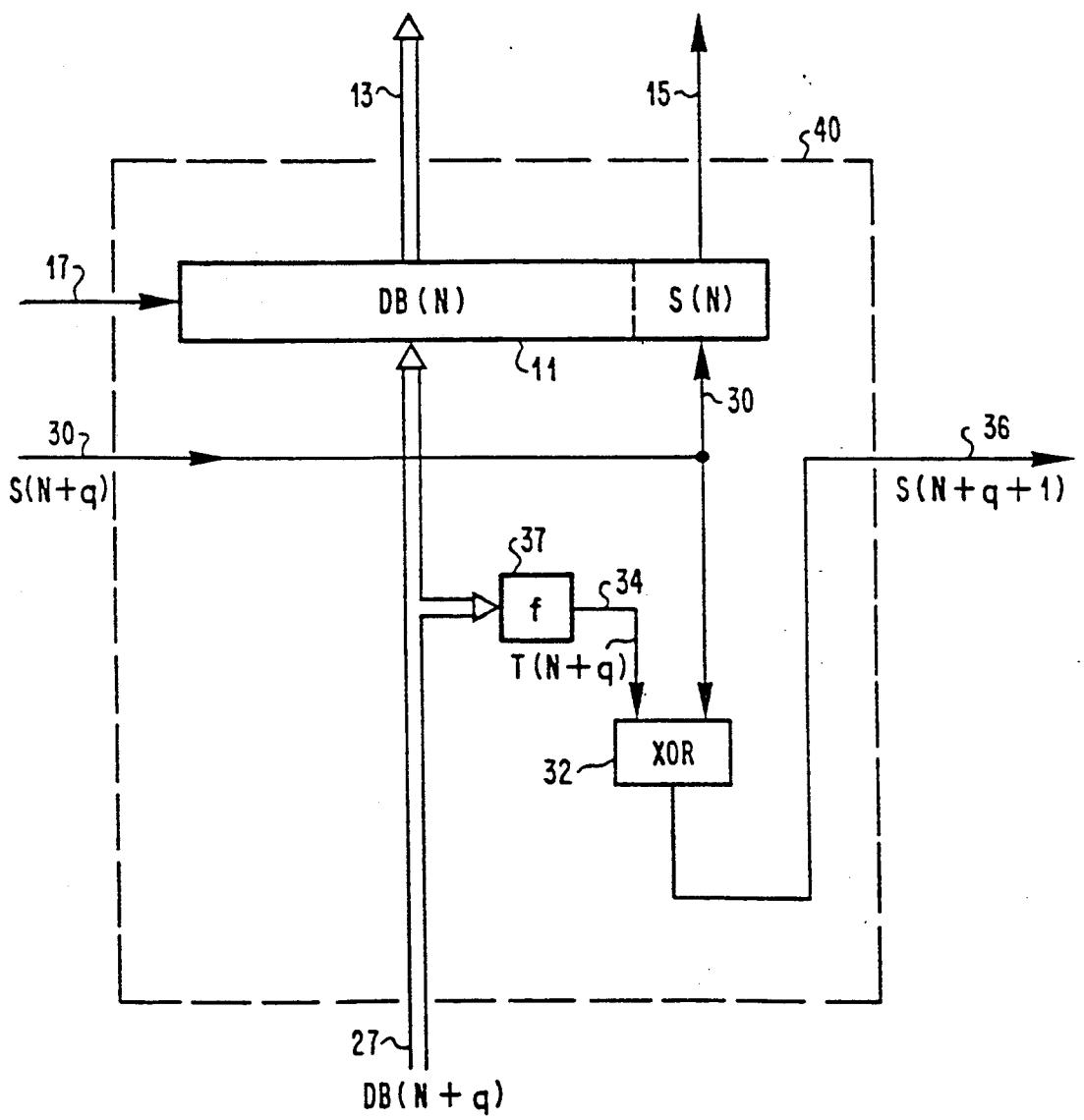
FIG. 4 is another form of the register stage of the basic encoder circuitry of FIG. 2, suitable for parallel operation.

FIGS. 2, 3, and 4 show different forms of a basic coder unit operating according to the invention. This unit receives at its input a data byte, and furnishes at its output an encoded byte (or "code byte" as it will be designated shortly in the sequel).

In the coder unit shown in FIG. 2 a register 11 holds the k-bit data byte DB(N) presently being encoded, plus a coder state bit S(N) indicating the encoder state when the respective data byte is encoded. The contents of the register had been loaded by a clock signal CL−1 on line 17. The data byte is available on lines 13 (k parallel bit lines), the state bit on line 15. Together, they are furnished to encoder 19 which is merely a look-up table furnishing, when addressed by the input on lines 13 and 15, at its output lines 21 an m-bit code byte CB(N). This is stored in an output register 23 under control of the next pulse of clock signal CL−1 on line 17. The code byte can be obtained (serially) on an output line 25 when a shift clock signal CL−2 'is applied on line 44.

The next data byte DB(N+1) is presented on input lines 27. The next coder state bit S(N+1) will be generated on line 29 in dependence of the old coder state bit S(N) and a function of the old data byte, as was generally explained above: The coder state is either changed or not changed, depending on a binary function derived from the old data byte DB(N). There is provided an Exclusive-Or (XOR) gate 31, whose two inputs receive the old coder state bit S(N) on line 15 and a binary state transition function T on line 33, and whose output 35 furnishes the new coder state bit. Logic circuitry 37 is provided for deriving the binary state transition function T (state transition bit T) from the bits of the old data byte DB(N). When the next clock pulse of the clock signal CL−1 occurs on line 17, the new data byte DB(N+1) and the new coder state bit S(N+1) are loaded into register 11.

Register 11, XOR gate 31, and logic 37 together form a "data register and coder state block" 39, designated as DRCS block 39 in the sequel, indicated by a dotted line box in FIG. 2. The basic encoder unit comprises two pipeline stages: Stage 1 consists of the DRCS block 39, preparing the coding of the next data byte DB(N+1); stage 2 is the actual encoder which is merely a table look-up function for converting data byte DB(N) plus its associated state bit S(N) into a code byte CB(N).

A somewhat simpler form of the basic coder unit is shown in FIG. 3. In the modified form, the state transition bit T on line 33 is simply identical to the last bit (D7) of the respective data byte. This eliminates the need for logic circuitry 37, as shown in FIG. 3. Furthermore, this figure shows the preferred data byte length of 8 bits and code byte length of 10 bits. Thus, the coder is an 8/10 coder.

A modified form of the DRCS block is shown in FIG. 4. That modified form of the DRCS block is particularly suited for parallel arrangement of several basic coder units, which is an important advantage of the present invention. The modified DRCS block 40 also has a register 11 for holding the data byte DB(N) to be encoded, plus the associated encoder state bit S(N). Both are furnished on output lines 13 and 15, respectively. The next data byte DB(N+q) is entered through lines 27. However, the next coder state bit S(N+q) is furnished from another section on line 30. A further coder state bit S(N+q+1) is derived in XOR gate 32, by combining coder state bit S(N+q) with a state transition bit T(N+q) on line 34 which in turn is derived by logic 37 from the next data byte DB(N+q) available on lines 27. The derived future coder state bit S(N+q+1) is furnished on a line 36. (Of course, a simpler design is also possible for the preferred embodiment, by eliminating logic 37 and just connecting state selection bit line 34 to a single one of the data bit lines 27).

As has been previously mentioned, this encoder principle allows pipelined as well as parallel operation of the encoder. Several basic coder units, each comprising a modified DRCS block 40 (as shown in FIG. 4) and an encoder 19, can be combined in parallel, and the coder state bit can be simultaneously derived for each of them, by propagating it from section to section like a carry function.

3b. Multiple-Byte Encoder (Word Encoder)

The block diagram of an encoder comprising four parallel coder sections is shown in FIG. 5. It should be noted that it is of course possible to provide a larger number of parallel sections (e.g., 8 or 16) if that is desirable in a system.

In FIG. 5, those elements which are the same as in FIG. 2/3/4 but which are provided in multiple form, are designated by the same reference number with a letter attached to it. There are provided four DRCS blocks 40A, 40B, 40C, 40D each accepting on its input lines (27A . . . 27D) one input data byte and providing on its output lines (13A . . . 13D; 15A . . . 15D) a data byte DB to be encoded, and the corresponding coder state bit S. Of each DRCS block, one output (36A . . . 36D) furnishing a coder state bit for the next section, is connected to an input (30B, 30C, 30D, 30A) of the DRCS block for the next data byte; in the return connection between the last section D and the first section A, i.e. between output 36D and input 30A, there is provided a clocked delay stage 42 so that the coder state bit generated in the last section is entered into the first section only one clock interval later. This together constitutes the pipeline stage 1 of the four-byte parallel encoder (word encoder).

There are further provided four encoders 19A, 19B, 19C, 19D (lookup tables) each for encoding one data byte, and furnishing the code bytes on respective output lines (21A . . . 21D). The encoders constitute the pipeline stage 2 of the parallel byte encoder (word encoder). The coded bytes are loaded into respective output registers (23A . . . 23D) under control of the clock signal CL−1 on line 17. They can be furnished in serial form on output line 26, under control of a shift clock signal CL−2 on line 44. The frequency of this shift clock signal is forty times as much as that of the word clock signal CL−1.

Operation is as follows: At one point in time, the DRCS blocks (data register and coder state blocks) hold four data bytes DB(N) . . . DB(N+3), plus their respective associated coder state bits S(N) . . . S(N+3). They are available also on output lines 13A . . . 13D and 15A . . . 15D, and they address encoders 19A . . . 19D so that at the encoder outputs 21A . . . 21D, the coded bytes CB(N) . . . CB(N+3) are available simultaneously.

Also at this point in time, at the inputs of the DRCS blocks there are available input data bytes DB(N+4) . . . DB(N+7). While the coder state bit S(N+4) is available from delay unit 42 where it was entered in a previous step, to the input of DRCS block 40A, the coder state bits S(N+5) . . . S(N+7) are developed internal of the DRCS blocks 40A, 40B, 40C and furnished to the respective neighbor DRCS block 40B, 40C, 40D. Thus, while at the outputs of pipeline stage 1 there are available data bytes DB(N) . . . DB(N+3) and their corresponding coder state bits, at the inputs of pipeline stage 1 there is waiting the next group (word) of data bytes DB(N+4) . . . DB(N+7) and their respective corresponding coder state bits.

Then, when the next pulse of word clock signal CL−1 occurs, coded bytes CB(N) . . . CB(N+3) are loaded into output registers 23A . . . 23D, the new data bytes DB(N+4) . . . DB(N+7) are loaded into the pipeline registers in the DRCS blocks, and the previous data bytes DB(N) . . . DB(N+3) disappear. The coder state bit S(N+8) which had already been derived from data byte DB(N+7) and coder state bit S(N+7), is then stored in clocked delay stage 42, to be available when the following group of data bytes DB(N+8) ff. is to be handled.

This piplined and parallel processing, which is possible because of the simultaneous generation of four sequential coder state bits, results in very fast operation. Assuming an uncoded data rate of 240 Mbyte/s, the resulting serial encoded data rate (on output line 26) will be 2.4 Gbit/s. This corresponds to an encoder cycle time of 16.7 ns.

3c. Details of an 8B/10B Block Coder

FIGS. 6A/6B show a more detailed circuit diagram of a multi-byte block encoder whose principle was shown in FIG. 5. Again, the same reference numerals were used for items already shown in FIGS. 2/3/4 and in FIG. 5. The encoder comprises four pipeline registers 11A . . . 11D, four encoders (look-up tables) 19A . . . 19D, and four output registers 23A . . . 23D.

State update is performed by a chain of four XOR gates 32A . . . 32D, and state updating percolates across the 4-byte word thus updating all four coder state bits S. A clocked one-bit delay stage 42 is provided for keeping the output of the last XOR gate 32D up to the next clock interval, so that it can then be used for the first pipeline register 11A.

For holding the input data bytes before they enter the first pipeline stage of the encoder, four input registers 51A . . . 51D are provided. They are loaded with new data bytes under control of clock signal CL−1 on line 17. The individual bits of each data byte DB are designated as D0 . . . D7.

The embodiment of FIG. 6A/6B shows in all data byte registers an additional bit Z, and also an input line Z in parallel with the data bit lines D0 . . . D7. This additional bit determines whether the respective data byte constitutes an actual data byte (Z=0) or a control byte (Z=1). As was explained earlier, a large number of control bytes are possible with the new coding scheme, and they have to be distinguished from the data bytes per se. These control bits Z are also entered into the pipeline registers, and they are used, together with the associated data byte DB(N) and state bit S(N) as a combined address for accessing the encoder lookup table (19A etc.). The respective address bits are designated as A0 . . . A7, A8, and A9 as is shown in FIG. 6A/6B.

Each encoder table is a ROM storing $2^{10}$ (i.e., 1024) ten-bit code bytes, which is addressed by the 10-bit input present in pipeline register (11A etc.). Thus, the remaining encoding process effected in pipeline stage 2 is a mere conversion from one set of 10-bit bytes into another.

The output of each look-up table 19A . . . 19D is a ten-bit code byte Q0 . . . Q9 which is transferred into an output register (23A . . . 23D) (under control of the clock signal CL−1 on line 17).

The contents of all four output registers 23A . . . 23D are transferred under control of a special load clock signal (provided on line 53) into a serializer 55 which converts the 40-bit (4-byte) word provided at the inputs, into a stream of 40 sequential bits on output line 26, representing four sequential code bytes (under control of shift clock CL−2 provided on line 44).

Further explanation of the operation of this circuitry appears not necessary because it is equal to the operation of the encoder explained in connection with FIG. 5.

3d. Details of a 10B/8B Decoder

The respective decoder for converting a bit stream representing sequential 10-bit code bytes into 8-bit data bytes is shown in FIGS. 7A/7B.

Decoding of a byte does not depend at all from previous transmitted bytes and is performed by look-up tables. This feature of the block code prevents any error propagation caused by transmission bit errors. As a consequence, the decoder needs no portions for handling state bits, as is the case for the encoder.

The coded bit stream appearing on input line 57 is entered into a deserializer 59 under control of a shift clock on line 61. The serializer also generates a word clock on line 63 (which furnishes one clock pulse for each group of four bytes, i.e., for each word).

Four code bytes CB(N) . . . CB(N+3), when available in the serializer, are transferred under control of the word clock signal into four decoder input registers 65A . . . 65D. The output of these registers (bits B0 . . . B9 of each code byte) addresses four decoder tables (look-up tables) 67A . . . 67D. Their outputs in turn are the decoded data bytes (each comprising bits P0 . . . P7) plus a respective associated control bit Z (P8) which determines whether the associated data byte represents actual data or a control byte.

The decoded data bytes, in the present example DB(N−4) . . . DB(N−1) plus respective control bits Z, are stored in four decoder output registers 69A . . . 69D, under control of the word clock available on line 63. Each byte is then available on respective output lines D0 . . . D7 (71A . . . 71D) and Z (73A . . . 73D).

4. Alternatives

Some alternatives or improvements to the basic units and embodiments which were explained above, are described in the following sections.

4a. Modified Basic Coder Unit

In FIG. 4, a DRCS block (data register and coder state block) was shown which is suited for parallel arrangement to allow simultaneous processing of several (e.g. four) input data bytes. When such units are used, a certain transition time is needed after application of a new set of input data bytes, until the state bit S of the last one of the parallel sections assumes its new value. This transition time is equal to the transition time of the logic units 37 (changing their states simultaneously in all parallel sections), plus the time needed for the new state values to ripple through the XOR gates 32 of all parallel sections which are arranged in a series connection. Thus, the maximum rate of the clock signal CL-1 on line 17 that can be used depends on the length of this transition time.

To avoid any delay due to this transition time necessary for developing the new coder state values S, a modified version of the DRCS block can be provided as shown in FIG. 8. In this unit, the state transition bit T is derived in advance from the input bytes DB.

Portion 40-1 of the DRCS block comprises register 11 for the data byte DB(N) presently being encoded and its associated state bit S(N), and an XOR unit 32 for combining the state bit $S(N+q)$ from the neighbor section, and a state transition bit $T(N+q)$ which is provided on line 34'.

An additional DRCS block portion 40-2 must be provided to allow for the advance generation of the state transition bit T. This portion 40-2 comprises an additional register 75 for holding the next data byte $DB(N+q)$ for the respective coder section, plus the respective state transition bit $T(N+q)$. The input to register 75 are lines 27' on which the over-next data byte $DB(N+2q)$ for the respective section is received. Logic circuitry 38 is connected to these input lines 27', for deriving the over-next state transition bit $T(N+2q)$ from the over-next data byte. This advance state transition bit will be stored, when the next clock pulse occurs on lines 17, together with the respective data byte in register 75.

This modified DRCS block allows a faster operation and thus a higher clock rate than the embodiment shown in FIG. 4, at the expense of one extra register 75 for each of the parallel byte sections of the encoder.

4b. Modified Coder State Bit Propagation

In the DRCS block shown in FIG. 8, the coder state bit $S(N+q)$ for the prestored data byte $DB(N+q)$ is received from the left neighbor section, the necessary state transition bit $T(N+q)$ is stored with the prestored data byte $DB(N+q)$, and in XOR gate 32, the coder state bit $S(N+q+1)$ for the right neighbor section is developed.

In a modified form, a state transition bit $T(N+q-1)$ and a coder state bit $S(N+q-1)$ could be received from the left neighbor section (which would require two transition lines for T and S instead of only one for S), and the XOR unit would be employed for developing the coder state bit $S(N+q)$, for use in the respective section and for transfer to the right neighbor section. The prestored state transition bit $T(N+q)$ then would not be used in the respective section, but would also be transferred to the right neighbor section. For transfer of a coder state bit S and a state transition bit T from the rightmost section back to the leftmost section, two delay registers 42 would be required instead of only one.

4c. Parallel Sections for Different Byte Sizes

It should be noted here that the term "byte" used in this description, means any bit group having a predetermined number of bits, as was explained already at the end of the introduction.

In the parallel-pipelined encoders shown in FIG. 5 and FIG. 6A/6B, respectively, all parallel sections are designed for the same data byte size having k bits (or specifically: 8 bits), and the same code byte size having m bits or specifically: 10 bits).

With the coding principle of the invention, one can also have different byte sizes in the parallel sections. For example, assuming a coder with four parallel byte sections, the first and third section could provide p/r block encoding (e.g. 9/10 block encoding), whereas the second and fourth section (which are interconnected with the first and third section) could provide u/w block encoding (e.g. 7/8 block encoding). Any mixture of units with different byte sizes is possible, depending on the application and coding requirements. It is only necessary that each section provides the next state bit S to the neighbor section, so that this neighbor section can also develop a next coder state bit from the coder state bit received from the other section, and from the state transition function of its own next data byte.

4d. Multi-bit coder state indicator and multi-bit state transition indicator The cases described so far have restricted the coder state function S(i) and the state transition function T(i) to binary variables assuming the values 0 or 1. Therefore, they were termed "coder state bit S(i)" and "state transition bit T(i)", respectively, in the description of the preferred embodiment. The basic feature of the invention, according to which $S(i+1)=g(S(i),T(i))$, i.e., $S(i+1)$, the state of the finite state encoder at time $i+1$ depends on the previous state S(i) and the state transition indicator $T(i)=f(D_0(i), D_1(i), \ldots, D_{k-1}(i))$, is also applicable when coder state indicator S(i) and state transition indicator T(i) assume s and t possible values, respectively. In this case, $CEIL(\log_2 s)$ and $CEIL(\log_2 t)$ bits are needed to represent S(n) and T(n), respectively, where CEIL(x) is the smallest integer greater or equal to x. It should be noted that all registers should have the appropriate size to be able to store S(i) and T(i). For example, in a coder unit corresponding to FIG. 8 register 11 would have to store (k+s) bits whereas register 75 would have to store (k+t) bits. Also in FIGS. 2 . . . 8, the XOR block 31, 32 would have to be replaced by logic circuitry implementing the Boolean function g, and whenever more than one bit is needed to represent S(i) or/and T(i) the corresponding lines would have to be multiple lines for transmitting multi-bit variables.

TABLE 1

CODE BYTE LIST P:

| | | | | |
|---|---|---|---|---|
| 0010101011 | 0010101101 | 0010101110 | 0010110011 | 0010110101 |
| 0010110110 | 0010111001 | 0010111010 | 0010111100 | 0011001011 |
| 0011001101 | 0011001110 | 0011010011 | 0011010101 | 0011010110 |
| 0011011001 | 0011011010 | 0011011100 | 0011100101 | 0011100110 |
| 0011101001 | 0011101010 | 0011101100 | 0011110010 | 0011110100 |
| 0100101011 | 0100101101 | 0100101110 | 0100110011 | 0100110101 |

TABLE 1-continued

CODE BYTE LIST P:

| | | | | |
|---|---|---|---|---|
| 0100110110 | 0100111001 | 0100111010 | 0101001011 | 0101001101 |
| 0101001110 | 0101010011 | 0101010101 | 0101010110 | 0101011001 |
| 0101011010 | 0101100011 | 0101100101 | 0101100110 | 0101101001 |
| 0101101010 | 0101110001 | 0101110010 | 0110001011 | 0110001101 |
| 0110001110 | 0110010011 | 0110010101 | 0110010110 | 0110011001 |
| 0110011010 | 0110011100 | 0110100011 | 0110100101 | 0110100110 |
| 0110101001 | 0110101010 | 0110101100 | 0110110001 | 0110110010 |
| 0110110100 | 0110111000 | 0111000101 | 0111000110 | 0111001001 |
| 0111001010 | 0111001100 | 0111010001 | 0111010010 | 0111010100 |
| 0111011000 | 0111100010 | 0111100100 | 1000101011 | 1000101101 |
| 1000101110 | 1000110011 | 1000110101 | 1000110110 | 1000111001 |
| 1000111010 | 1001001011 | 1001001101 | 1001001110 | 1001010011 |
| 1001010101 | 1001010110 | 1001011001 | 1001011010 | 1001011100 |
| 1001100011 | 1001100101 | 1001100110 | 1001101001 | 1001101010 |
| 1001101100 | 1001110001 | 1001110010 | 1001110100 | 1010001101 |
| 1010001110 | 1010010101 | 1010010110 | 1010011001 | 1010011010 |
| 1010011100 | 1010100011 | 1010100101 | 1010100110 | 1010101001 |
| 1010101100 | 1010110001 | 1010110010 | 1010110100 | 1010111000 |
| 1011000101 | 1011000110 | 1011001001 | 1011001010 | 1011001100 |
| 1011000001 | 1011010010 | 1011010100 | 1011011000 | 1011100001 |
| 1011100010 | 1011100100 | 1100001011 | 1100001101 | 1100010011 |
| 1100010101 | 1100010110 | 1100011001 | 1100011010 | 1100100011 |
| 1100100101 | 1100100110 | 1100101001 | 1100101010 | 1100101100 |
| 1100110001 | 1100110010 | 1100110100 | 1101000011 | 1101000101 |
| 1101000110 | 1101001001 | 1101001010 | 1101001100 | 1101010001 |
| 1101010010 | 1101010100 | 1101011000 | 1101100001 | 1101100010 |
| 1101100100 | | | | |

SUM = 161

TABLE 2

CODE BYTE LIST Q:

| | | | | |
|---|---|---|---|---|
| 0010111011 | 0010111101 | 0011011011 | 0011011101 | 0011011110 |
| 0011101011 | 0011101101 | 0011101110 | 0011110101 | 0011110110 |
| 0011111010 | 0100111011 | 0100111101 | 0100111110 | 0101011011 |
| 0101011101 | 0101011110 | 0101100111 | 0101101011 | 0101101101 |
| 0101101110 | 0101110101 | 0101110110 | 0101111001 | 0101111010 |
| 0101111100 | 0110011011 | 0110011101 | 0110011110 | 0110100111 |
| 0110101011 | 0110101101 | 0110101110 | 0110110011 | 0110110101 |
| 0110110110 | 0110111001 | 0110111010 | 0110111100 | 0111001011 |
| 0111001101 | 0111001110 | 0111010011 | 0111010101 | 0111010110 |
| 0111011001 | 0111011010 | 0111011100 | 0111100101 | 0111100110 |
| 0111101001 | 0111101010 | 0111101100 | 1000111011 | 1000111101 |
| 1001011011 | 1001011101 | 1001011110 | 1001100111 | 1001101011 |
| 1001101101 | 1001101110 | 1001110011 | 1001110101 | 1001110110 |
| 1001111001 | 1001111010 | 1010011011 | 1010011101 | 1010011110 |
| 1010100111 | 1010101011 | 1010101101 | 1010101110 | 1010110011 |
| 1010110101 | 1010110110 | 1010111001 | 1010111010 | 1010111100 |
| 1011000111 | 1011001011 | 1011001101 | 1011001110 | 1011010011 |
| 1011010101 | 1011010110 | 1011011001 | 1011011010 | 1011011100 |
| 1011100011 | 1011100101 | 1011100110 | 1011101001 | 1011101010 |
| 1011101100 | 1011110001 | 1011110010 | 1011110100 | 1100001111 |
| 1100011101 | 1100100111 | 1100101011 | 1100101101 | 1100101110 |
| 1100110011 | 1100110101 | 1100110110 | 1100111001 | 1100111010 |
| 1101000111 | 1101001011 | 1101001101 | 1101001110 | 1101010011 |
| 1101010101 | 1101010110 | 1101011001 | 1101011010 | 1101011100 |
| 1101100011 | 1101100101 | 1101100110 | 1101101001 | 1101101010 |
| 1101101100 | 1101110001 | 1101110010 | 1101110100 | |

SUM = 129

We claim:

1. Method for encoding sequential k-bit data bytes into sequential m-bit code bytes satisfying predetermined constraints, where k<m, using a coding procedure having at least two states,
the method comprising the following steps:
generating a state transition indicator T(i−1) for the encoding of each data byte DB(i), in dependence of the bit values of the respective preceding data byte DB(i−1); and
encoding q data bytes DB(N) ... DB(N+q−1) in parallel by
generating simultaneously a coder state indicator S(i) for each data byte DB(i) of a set of q data bytes, by logically combining the coder state indicator S(i−1) associated with the respective preceding data byte DB(i−1) and the state transition indicator T(i−1) generated in dependence of the respective preceding data byte DB(i−1), and
converting each data byte DB(i) of the set of q data bytes together with the associated coder state indicator S(i) into an assigned m-bit code byte CB(i).

2. A method according to claim 1, wherein
a two-state coding procedure is used, and
said coder state indicator S(i) and said state transition indicator T(i−1) are binary quantities represented by a state transition bit and a coder state bit, respectively.

3. Method according to claim 2, comprising the further step of
logically combining the coder state bit S(i−1) associated with the preceding data byte DB(i−1) and the state transition bit T(i−1) generated in dependence of the preceding data byte DB(i−1) in an Exclusive Or operation such that the value of the state transition bit T(i−1) determines whether the binary coder state associated with the preceding data byte is maintained or is changed for the current data byte.

4. Method according to claim 2, comprising the step of
selecting the state transition bit T(i−1) to be equal to a particular one (D7) of the bits of the preceding data byte DB(i−1).

5. Method according to claim 2, comprising the further step of
keeping a coder state bit S(N+q) which was generated in dependence of the last data byte DB(N+q−1) of one set and its associated coder state bit S(N+q−1), in a separate register (42), and using this coder state bit S(N+q) after a given delay as input for the encoding of the first data byte DB(N+q) of the next set of q data bytes DB(N+q)... DB(N+2q−1).

6. Method according to claim 2, comprising the additional steps of
furnishing with each data byte DB(i) an additional control bit Z(i) for determining whether the respective data byte represents actual data or control information, and
converting each data byte DB(i) together with the associated coder state bit S(i) and the associated control bit Z(i) into an assigned code byte CB(i).

7. Method according to claim 1, wherein the m-bit code bytes in any possible sequential arrangement satisfy the following constraints:
(a) the runlength of identical symbols is restricted to a predetermined value R;
(b) the transition density is not smaller than a predetermined value $TD_{min}$;
(c) the running digital sum RDS can assume only a predetermined number V of different values; and
(d) a predetermined synchronization pattern SP and its complement $\overline{SP}$ do not occur in any sequence of code words.

8. Method according to claim 7, wherein each code byte comprises m=10 bits, and wherein the constraints satisfied by the code bytes have the following values:
(a) the maximum runlength of identical symbols is R=5;
(b) the minimum transition density is $TD_{min}=40\%$;

(c) the number of different values for the running digital sum RDS is $V=7$; and (d) the synchronization pattern SP which is only used in a control mode when no data are transmitted, and which must never occur in any possible code word sequence is the bit sequence 1011111, and its complement $\overline{SP}$ which is only used in a control mode when no data are transmitted, and which must never occur in any possible code word sequence is the bit sequence 0100000.

9. Method according to claim 8, wherein the code bytes additionally satisfy the following constraint:

a synchronization byte imbedding the predetermined synchronization pattern SP (1011111), and its complement imbedding the complementary synchronization pattern $\overline{SP}$ (0100000) which are used during a control mode only and not during data transmission, differ from every one of the code bytes in at least two bits.

10. Coder for generating code bytes, comprising q parallel sections and at least two pipeline stages, each of said parallel sections being provided for converting an input data byte DB(i) into an output code byte CB(i), and including in a first pipeline stage (40), a register (11) for a data byte DB(i) and the associated coder state indicator S(i), and means (32) for generating a new coder state indicator; and in a second pipeline stage, code conversion means (19) receiving as inputs (13; 15) a data byte DB(i) and the associated coder state indicator S(i), and furnishing at its output (21) the respective code byte CB(i);

interconnection means (30; 36) being provided between the first pipeline stages of neighbor sections for transferring a coder state indicator from one section to the next.

11. Coder apparatus according to claim 10, wherein the new coder state indicator generated in each section is the coder state indicator $S(i+q+1)$ which is to be associated with the next data byte $DB(i+q+1)$ to be encoded in the neighbor section, and this new coder state indicator $S(i+q+1)$ is transferred on said interconnection means (30; 36) to the respective neighbor section.

12. Coder apparatus according to claim 10, wherein the new coder state indicator generated in each section is the coder state indicator $S(i+q)$ which is to be associated with the next data byte $DB(i+q)$ to be encoded in the same section;

this new coder state indicator $S(i+q)$ is transferred on said interconnection means (30; 36) to the respective neighbor section;

additional interconnection means are provided for transferring a state transition indicator $T(i+q)$ to the neighbor section; and said means (32) for generating a new coder state indicator receives as inputs a coder state indicator and a state transition indicator transferred on said interconnection means and on said additional interconnection means from the neighbor section.

13. Coder apparatus according to claim 10, wherein said coder has two different states, said state transition indicator is a binary quantity represented by a state transition bit T, and said coder state indicator is a binary quantity represented by a coder state bit S; said coder apparatus comprising:

means (34, 37; 34', 38, 75) for deriving a state transition bit $T(N+q)$ from a given data byte $DB(N+q)$, and logic means (32) combining said state transition bit $T(N+q)$ and the coder state bit $S(N+q)$ associated with said given data byte $DB(N+q)$, and furnishing a new coder state bit $S(N+q+1)$ to be associated with the data byte $DB(N+q+1)$ following said given data byte $DB(N+q)$.

14. Coder apparatus according to claim 10, comprising as code conversion means in each of the q parallel sections:

read-only table look-up memory means (19A...19D) storing all possible output code bytes CB(i);

said table look-up memory means being addressed (15A...15D; A0...A9) by the contents of said register (11A...11D) in the first pipeline stage.

15. Coder apparatus according to claim 10, further comprising an additional third pipeline stage (40-2) in each of the q parallel sections, said third pipeline stage including an additional register (75) for holding a next block's data byte $DB(N+q)$ to be encoded and a state transition indicator $T(N+q)$ derived from it, and logic means (38) for generating in advance a state transition indicator $T(N+2q)$ from an advanced next block's data byte $DB(N+2q)$ available at the input of said third pipeline stage; the output of said logic means being connected to an input of said additional register (75).

16. Coder apparatus according to claim 10, comprising at least two sections having different register sizes and different numbers of bit lines for transferring data bytes and code bytes, to allow simultaneous encoding of data bytes having a first data byte width p into code bytes having a first code byte width q in one section, and encoding of data bytes having a second data byte width u into code bytes having a second code byte width w in another section.

17. Coder apparatus according to claim 10, comprising in each of said registers (11A...11D) in said first pipeline stage, an additional bit position for a control bit Z(i); said code conversion means (19) receiving as additional input a control bit Z(i) together with a data byte DB(i) and the associated coder state indicator S(i).

* * * * *